United States Patent
Bayan et al.

(10) Patent No.: US 6,551,048 B1
(45) Date of Patent: Apr. 22, 2003

(54) OFF-LOAD SYSTEM FOR SEMICONDUCTOR DEVICES

(75) Inventors: Jaime Bayan, Palo Alto, CA (US); Peter Howard Spalding, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 20 days.

(21) Appl. No.: 09/614,930

(22) Filed: Jul. 12, 2000

(51) Int. Cl.$^7$ .................................................. B26F 3/00
(52) U.S. Cl. .............................. 414/416.1; 414/222.01; 414/806
(58) Field of Search ................................ 414/936–941, 414/222, 403, 416, 416.1, 416.11, 416.01, 416.02

(56) References Cited

U.S. PATENT DOCUMENTS

| | | | |
|---|---|---|---|
| 3,940,908 A | * 3/1976 | Dazen et al. ................. 53/59 R |
| 4,044,937 A | * 8/1977 | Hill et al. ....................... 225/97 |
| 4,423,815 A | * 1/1984 | Boissicat ...................... 209/655 |
| 4,556,362 A | * 12/1985 | Bahnck et al. ............ 414/744 B |
| 4,915,565 A | * 4/1990 | Bond et al. ................... 414/225 |
| 4,958,982 A | * 9/1990 | Champet et al. ............. 414/751 |
| 4,978,253 A | * 12/1990 | Lazzari ......................... 406/88 |
| 5,394,973 A | 3/1995 | Emmart et al. |
| 5,888,127 A | * 3/1999 | Piper et al. .................. 451/287 |
| 5,988,065 A | * 11/1999 | Schroeder et al. ........ 101/389.1 |
| 6,006,890 A | * 12/1999 | Crawford .................... 198/396 |
| 6,019,564 A | 2/2000 | Kiyokawa et al. |
| 6,283,693 B1 | 9/2001 | Acello et al. |

* cited by examiner

Primary Examiner—Eileen D. Lillis
Assistant Examiner—Charles A. Fox
(74) Attorney, Agent, or Firm—Beyer Weaver & Thomas LLP

(57) ABSTRACT

An off-loading system comprising an array of suction tubes which are each able to pick up an associated semiconductor device from the matrix of devices and a pump which pulls air through the suction tubes to create a sufficiently low pressure within the suction tubes to allow each suction tube to pick up an associated device. In another embodiment of the invention, the off-loading system also includes a pin board which supports an array of pins configured to raise a selected array of the semiconductor devices to assist in picking up the selected array of devices from the matrix of devices. Another embodiment of the invention includes a rack that includes multiple elongated rails which form multiple channels through which the semiconductor devices travel so that they may properly enter a subsequent phase of the manufacturing process. Another aspect of the invention pertains to a method for transporting semiconductor devices from a matrix of semiconductor devices during a semiconductor assembly process using the off-loading system of the present invention. The method includes picking up a selected array of semiconductor devices individually and simultaneously from the matrix and depositing at least one of the devices of the selected array onto a handling station. In one embodiment of the method, the selected array of the semiconductor devices are raised relative to the other semiconductor devices in the matrix in order to assist in picking up the selected array of packaged devices from the matrix.

34 Claims, 6 Drawing Sheets

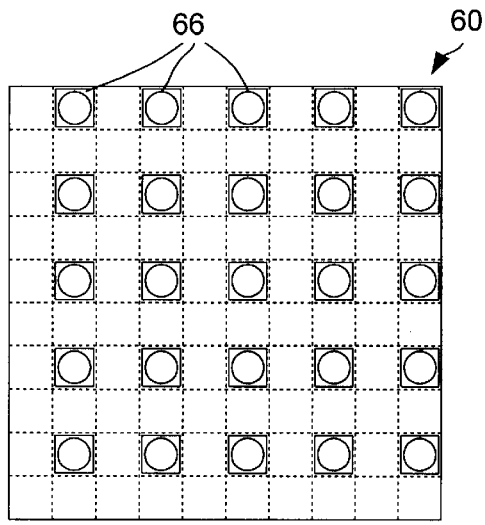
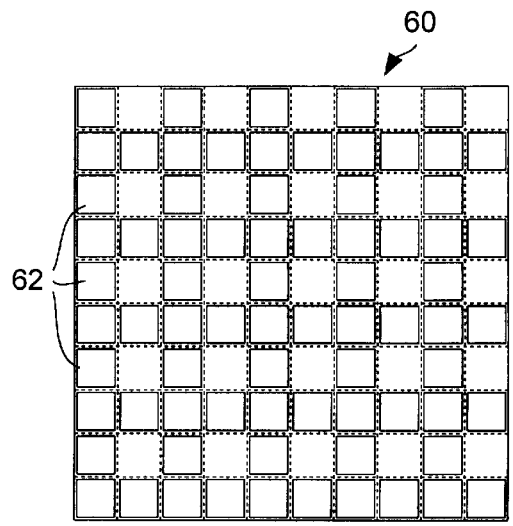
FIG. 5A                FIG. 5B
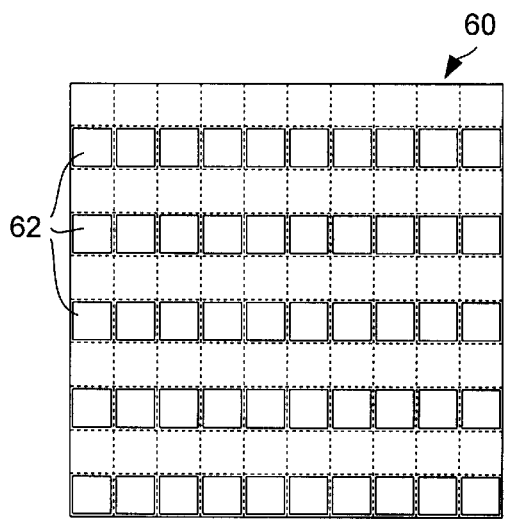
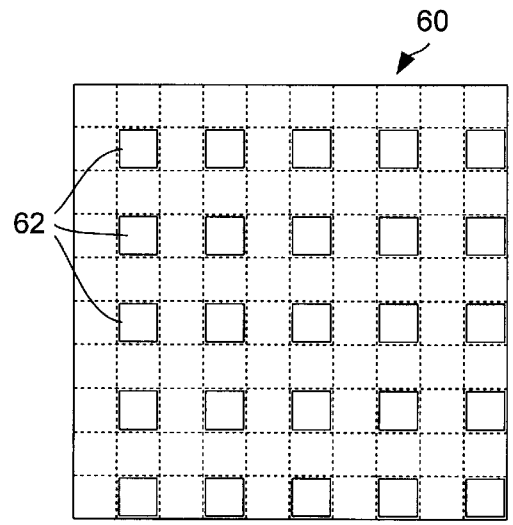
FIG. 5C                FIG. 5D

OFF-LOAD SYSTEM FOR SEMICONDUCTOR DEVICES

FIELD OF THE INVENTION

The present invention relates generally to semiconductor device off-loading systems, and more specifically, to semiconductor device off-loading systems capable of handling and transporting a large number of semiconductor devices per hour.

BACKGROUND

Semiconductor device manufacturers generally manufacture semiconductor devices in large quantities in order to increase the efficiency of various production phases within the process. By increasing the efficiency of the production process, the marginal cost for producing each additional device is decreased. The efficiency of the production process is further increased by increasing the speed with which the semiconductor devices are produced. The speed at which semiconductor devices are produced is measured by the number of devices, or units, which can be produced per hour (UPH). This is generally referred to as the system "throughput" rate.

A fundamental practice used for increasing the speed and efficiency of the semiconductor production process is to produce a large number of semiconductor devices simultaneously during each phase of an "assembly-line type" manufacturing process. This is accomplished, in part, by forming multiple semiconductor devices upon a wafer. Each of the following semiconductor processing stages are then designed to perform a respective processing operation multiple times for each of the devices within the wafer. After each semiconductor device is separated from the wafer, some production processes place the individual devices on frames which secure multiple devices in a matrix (i.e., in rows and columns). These frames allow many semiconductor devices to simultaneously undergo further stages of production.

Eventually, the production process must handle and transport ("off-load") individual semiconductor devices, which have been separated from a wafer or frame. In order to maintain the throughput rate for the production process, the systems for off-loading the semiconductor devices must be able to operate at a high throughput rate. Currently, off-loading systems transport packaged semiconductor devices one-at-a-time between production phases. This manner of transportation allows for an over-all system throughput rate of approximately 5000 units per hour (UPH). Unfortunately, at this rate, the off-loading system creates a bottle-neck in the overall production process. To compensate for the low off-loading rates, multiple off-loading systems may be utilized, however, the additional off-loaders would increase the cost of the production process and require extra space in the production facility. In light of the forgoing, an off-loading system capable of a high UPH would be desirable.

SUMMARY

The present invention is directed to an off-loading system for a semiconductor manufacturing process which is capable of transporting a high number of semiconductor devices per hour. Generally, the off-loading system of the present invention transports devices at a high rate of speed by individually transporting multiple semiconductor devices from a matrix of semiconductor devices. The off-loading system, according to one embodiment of the invention, includes an array of suction tubes which are each able to pick up an associated semiconductor device from the matrix of devices and a pump which pulls air through the suction tubes to create a sufficiently low pressure within the suction tubes to allow each suction tube to pick up an associated device. In another embodiment of the invention, the off-loading system also includes a pin board which supports an array of pins configured to raise a selected array of the semiconductor devices to assist in picking up the selected array of devices from the matrix of devices. The invention may also include a control system which allows the off-loading system to transport only selected semiconductor devices of the matrix of devices.

In another invention described herein, a rack is described for use in staging a multiplicity of packaged semiconductor devices in parallel. In some embodiments, the rack includes multiple elongated rails which are supported upon a base. The rails form multiple channels through which the semiconductor devices travel so that they may properly enter a subsequent phase of the manufacturing process.

Another aspect of the invention pertains to a method for transporting semiconductor devices from a matrix of semiconductor devices during a semiconductor assembly process using the off-loading system of the present invention. The method includes picking up a selected array of semiconductor devices individually and simultaneously from the matrix and depositing at least one of the devices of the selected array onto a handling station. In one embodiment of the method, the selected array of the semiconductor devices is raised relative to the other semiconductor devices in the matrix in order to assist in picking up the selected array of packaged devices from the matrix.

In another embodiment of the method, the matrix of semiconductor devices is arranged in rows and columns and every other device, or every third device, within each of the rows and columns is picked up. The pickup process may be repeated such that all the semiconductor devices within the matrix may be off-loaded through multiple pick-up passes.

These and other features and advantages of the present invention will be presented in more detail in the following specification of the invention and the accompanying figures which illustrate by way of example the principles of the invention.

BRIEF DESCRIPTION OF THE DRAWINGS

The invention, together with further advantages thereof, may best be understood by reference to the following description taken in conjunction with the accompanying drawings in which:

FIG. 5A illustrates an alternative pattern in which semiconductor devices may be picked up from a matrix of semiconductor devices.

FIGS. 5B–5D shows the remaining semiconductor devices after each successive pick-up pass when the devices are picked up according to the pattern shown in FIG. 5A.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
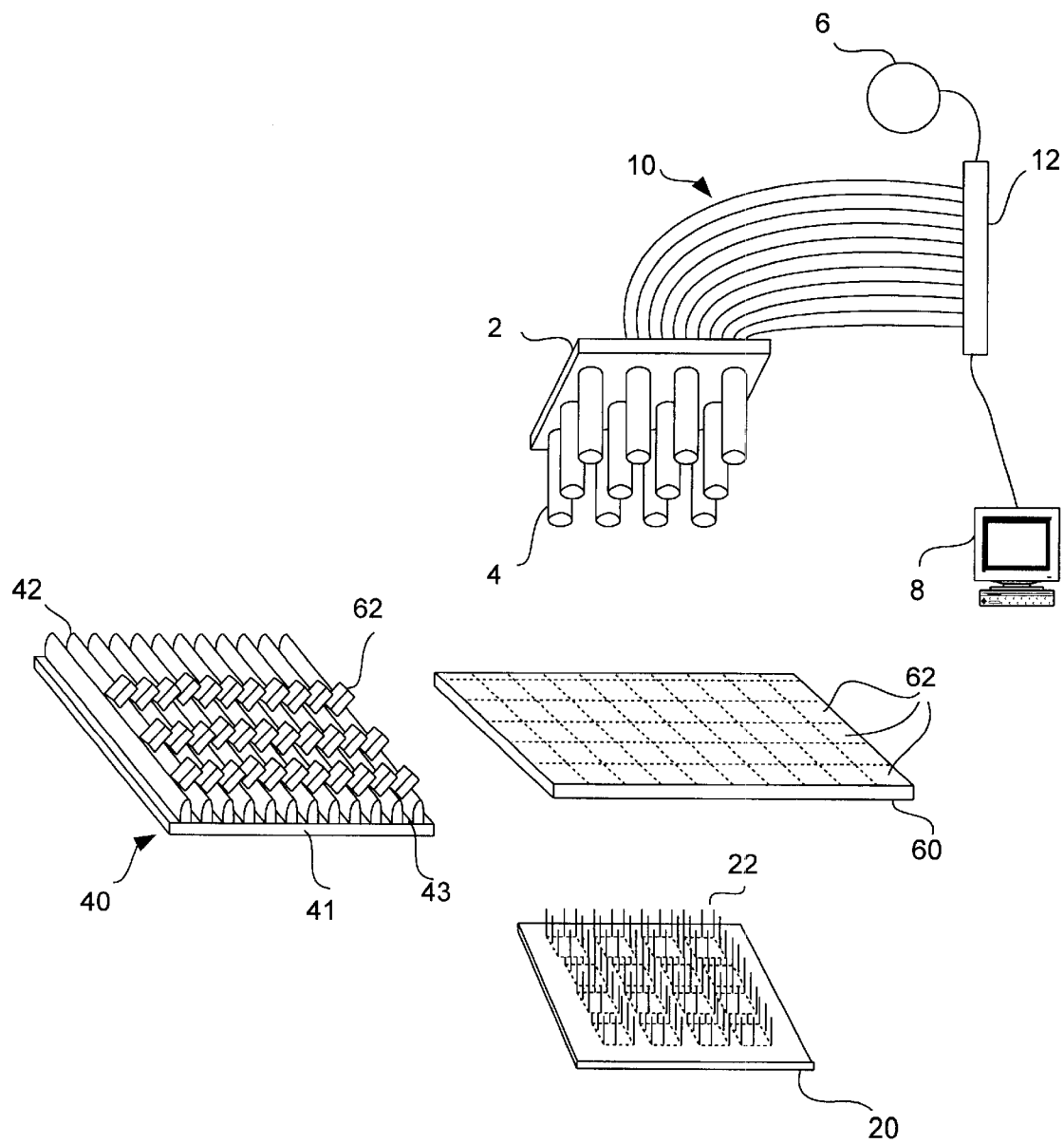
FIG. 1 illustrates a perspective view of the off-load system according to one embodiment of the invention.

A high unit-per-hour (UPH) off-load system, according to one embodiment of the present invention, is illustrated in FIG. 1. Generally, the present invention is capable of rapidly transporting a large number of individual semiconductor devices between stages of a semiconductor manufacturing process. The ability to rapidly transport a large number of semiconductor devices advantageously increases semiconductor production yields and allows for a more efficient production process. As shown within FIG. 1, an array of suction pick-up devices 4 are arranged so that each of the pick-up devices 4 may pick up a semiconductor device 62. Each of the semiconductor devices 62 are generally located and positioned within a matrix 60. In one embodiment of the invention, an array of pins 22, supported upon a pin-board 20, may be used to raise the devices 62 that are intended to be picked up. By raising the devices, the devices 62 may be brought into closer proximity with the pick-up devices 4 to facilitate the pick-up operation. The devices 62 that were picked up by the suction pick-up devices 4 are then deposited onto a rack 40. Then, by causing the devices 62 to travel along the rack 40, the devices are moved into a "registered" position. A registered position is a position where the devices 62 are moved to before they enter a next stage of processing, transportation, or any other stage of the semiconductor manufacturing process.

As illustrated in FIG. 1, the suction pick-up devices 4 are hollow tubes through which air can be pulled. Pulling air through each of the pick-up devices 4 creates a low-pressure zone within the pick-up devices 4 which allows each of the pick-up devices 4 to pick up a device 62. Each of the suction pick-up devices 4 is supported upon a pick-up device platform 2. The platform 2 may be any structure capable of positioning the pick-up devices such that the devices 62 may be picked up. The air is pulled through the suction pick-up devices 4 by pump 6. The suction pick-up devices 4 may be connected to the pump 6 via connection tubes 10 and manifold 12. The manifold 12 may have valves (not shown) placed along each of the connection tubes 10 so that the pressure within each suction pick-up device 4 may be controlled. Sometimes it may be desirable to expel air out through the suction pick-up devices 4 just before depositing the devices 62 to ensure detachment of the devices 62 from the pickup devices 4.

It should be noted that the pump 6 may be connected to each of the suction pick-up devices 4 via connection tubes 10 without the use of a manifold 12. It should also be noted that the suction pick-up devices 4 may be any type of device capable of picking up the semiconductor devices 62. For example, in one embodiment, pinchers may be used in place of the suction pick-up devices 4. In such an embodiment, the pump 6 would not be required.

A control system 8, embodied within a computer processing system, may be used to control which of the devices 62 are to be picked up out of the matrix 60. For instance, the control system 8 may accomplish this by controlling the valves, which are located within the manifold 12. In alternative embodiments of the invention, an electronic map of the matrix 60 that designates which of the devices 62 are to be picked up is used by the control system 8. Such a map, for instance, may be obtained from a testing system which has determined which of the devices within the matrix 60 are fully-functional and which are defective. In another embodiment of the invention, the control system 8 also serves as a counter which tracks the number of devices 62 off-loaded by the off-loading system. In yet another embodiment of the invention, the control system 8 is connected to sensors which determine whether devices 62 have been properly picked up or deposited by each of the pick-up devices 4. For instance, such sensors could be optical or mechanical.

The array of pins 22 on the pin-board 20 may be arranged so that one single pin pushes up on each of the semiconductor devices 62 which are intended to be picked up. In such an embodiment, each pin should have an upper portion having a diameter approximately equal to or smaller than that of each device 62. This upper portion of the pin will then be placed in contact with a respective device so that the pin may raise the device towards a pick-up device 4. In another embodiment, the array of pins 22 may be arranged so that more than one pin pushes up on each of the devices 62. In yet another embodiment, the array of pins 22 is arranged so that pins are used to puncture the tape which secures each device 62 within the matrix of devices 60, in addition to raising each of the devices 62. The devices 62 may also be selectively picked up by mechanically controlling groups of pins on the pin-board 20 so that only the devices 62 which are intended to be picked up are raised towards the pick-up devices. For instance, the pins may be programmed to raise only the fully-functioning devices, while not raising the defective devices.

The matrix 60 may take a wide variety of forms. By way of example, the matrix of dice may be formed upon a semiconductor wafer. Alternatively, the matrix of packaged devices may be formed upon a substrate or lead frame. As mentioned above, a matrix of devices may be held together by tape applied to a surface of the matrix. Generally, the matrix of devices are formed such that each of the semiconductor devices are connected to each other. At some point during the production process, individual semiconductor devices are separated from the matrix 60. Usually, the devices are separated with a circular saw.

Figure 2:
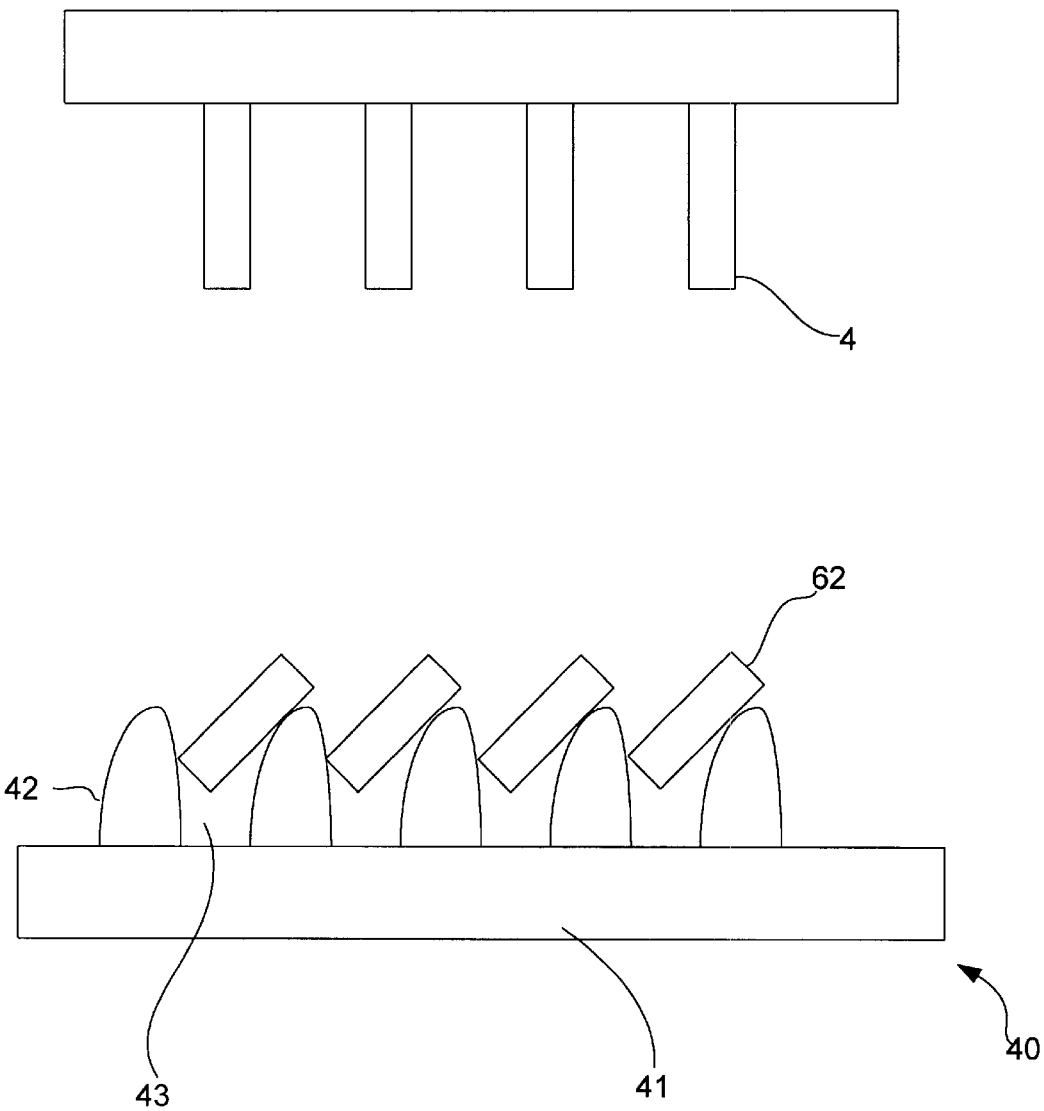
FIG. 2 illustrates a cross-sectional view of the rack and the array of pick-up devices according to one embodiment of the invention.

FIG. 2 illustrates a cross-sectional view of an array of pick-up devices 4 which have deposited devices 62, which have been separated from the matrix 60, on a rack 40. The rack 40 is used to "stage" the semiconductor devices 62. As can be seen, the rack 40 includes a set of rails 42 supported upon a base platform 41. The rails 42 are aligned next to each other such that the space between each of the rails becomes a channel 43 through which a device 62 may travel. The staging of multiple devices 62 causes the devices 62 to travel in unison along respective channels 43 after being deposited onto the rack 40 to registered positions. When in the registered position, the devices 62 are ready to enter the next phase of the semiconductor manufacturing process. For example, the next stage of the process may be to place each device 62 within a respective pocket of a carrier tape. This carrier tape may then be used to transport the devices 62 to either a customer or to another processing stage. Or, it would also be possible to place a tube at the end of each channel 43 so that the devices 62 within each of the channels can be deposited into a respective tube.

The devices 62 may be caused to travel through the channels 43 in a variety of manners. For instance, the entire rack 40 may be tilted so that the devices slide through the channels due to gravity. Another method would be to linearly vibrate the rack 40 such that in each cycle the devices 62 will be incrementally shifted through the channels 43. Yet another possibility would be to introduce a mechanism that would apply air pressure to push the devices 62 through the channels 43. As can be appreciated, many different methods could be used to cause the devices 62 travel along the channels 43.

As shown in FIG. 2, the channels 43 that are created by the rails 42 have widths that are narrower than the widths of the devices 62. This configuration prevents the devices 62 from laying flat on the bottom of the channels 43. In fact, this configuration forces the devices 62 to be propped up so that they lean on their sides at a specific angle. By varying the height of each rail, the steepness of the angle given to each rail 42, and the spacing between each of the rails 42, the devices 62 can be deposited onto the rack 40 so that the devices 62 come to rest in a predetermined orientation. In this manner, the devices 62 enter the next stage of processing in a desired orientation. This may be critical if the devices 62 must enter the next processing stage in a specific orientation so to allow manufacturing processes to be performed on a specific side of the devices.

Figure 3:
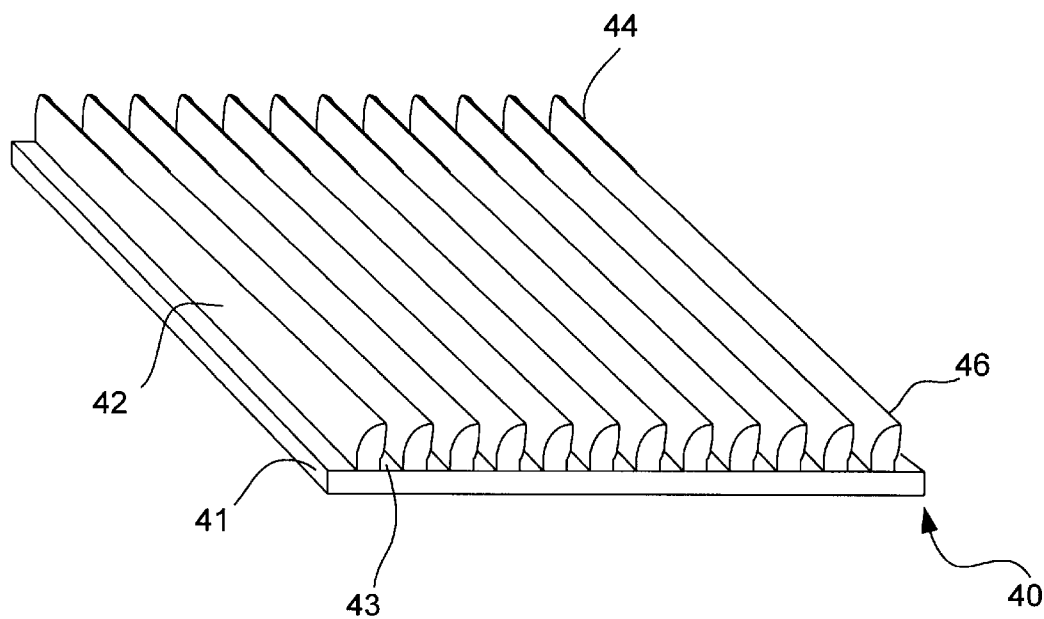
FIG. 3 illustrates an alternative embodiment of the rack in which the angle of taper changes along the length of each rail.

FIG. 3 illustrates an alternative embodiment of the rack 40. In FIG. 3, the rack 40 has rails 42 which have surfaces with a given angle at the back end 44 of the rack 40, and the same, but opposite angle at the front end 46 of the rack 40. The differing angles of the rails 42 at each end of the rack 40 cause the devices to lean against the rails 42 in different respective angles when located at each end of the rack 40. The angle of the rail surfaces shift from their given angle at one end, e.g., end 44, to the other end, e.g. end 46. The shift in the angle of the rails 42, which may be gradual or incremental, cause the devices to change the angle in which they lean upon the rails 42 as the devices travel through the channels 43. Essentially, the rails 42 allow the devices to be deposited upon the rack 40 so that they are supported at a predetermined angle at end 44, and yet, be supported at an opposite angle when at the other end 46 of the rack. The capability of the rails 42 is advantageous, for example, when devices must be turned upside-down so that an opposite surface of the devices may undergo manufacturing processes. As may be appreciated by those of skill in the art, the rails 42 may be formed to position the devices 62 in various orientations at either end of the rack 40.

Figure 4:
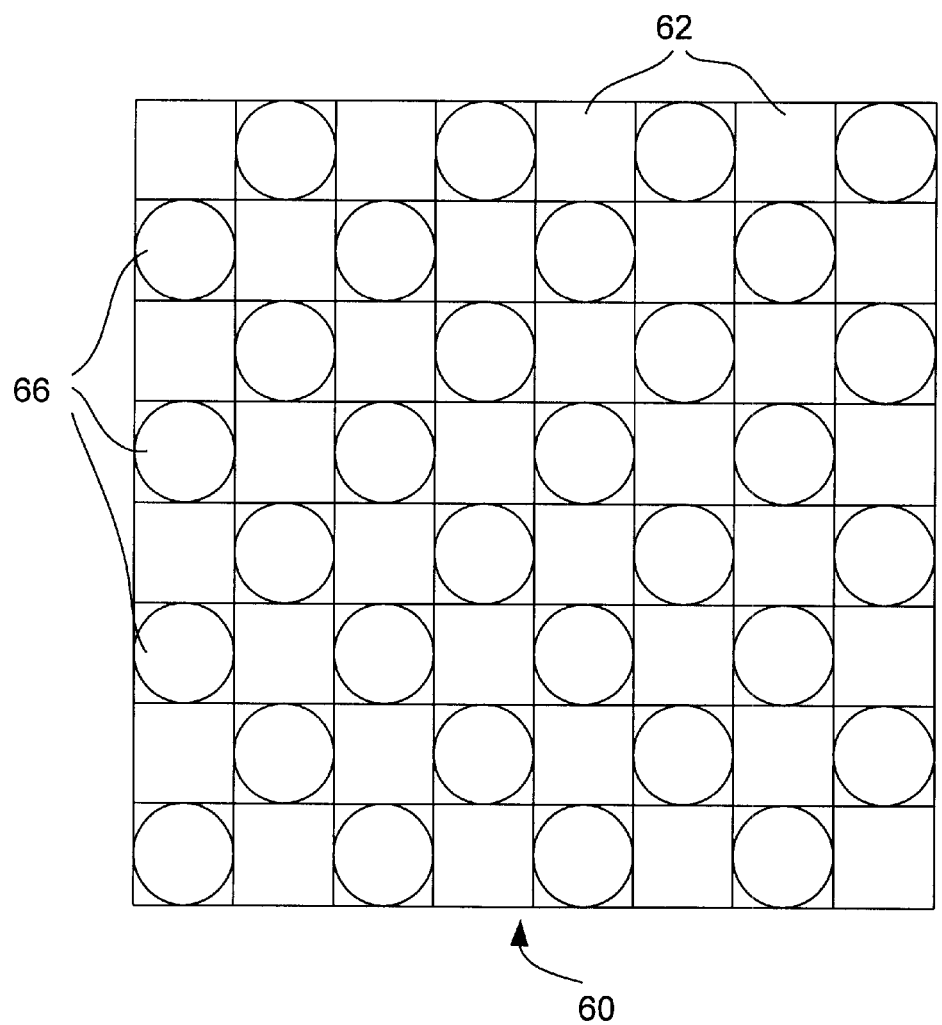
FIG. 4 illustrates a pattern in which semiconductor devices may be picked up from a matrix of semiconductor devices.

The array of suction pick-up devices 4 is provided so that multiple devices 62 may be picked up and deposited in a single off-loading pass. In this manner, it is possible to off-load an entire matrix of devices in a series of off-loading passes. In one embodiment of the invention, each of the devices of the array of devices to be picked up are adjacent to each other. In this case, complete sections of the matrix 60 will be removed by the array of pick-up devices 4 during each off-load pass. However, in certain situations it may not be possible to position the pick-up devices close enough to each other so that adjacent pick-up devices 4 are separated by the same distance by which adjacent devices 62, in the matrix 60, are separated. Therefore, it would not be possible to pick up an array of devices 62 wherein each of the devices were adjacent to each other. It would still be possible, however, to pick up non-adjacent devices 62 from the matrix 60. For instance, FIG. 4 illustrates a pattern representing the devices 62 which are to be picked up out of the matrix 60. The devices to be picked up, 66 (the devices 62 which are marked with a circle), are separated from each other by the devices which are not to be picked up in a pattern similar to that of a checker-board. Picking up devices 62 which are non-adjacent provides each pick-up device 4 with additional space in which to be located. After picking up and transporting one set of non-adjacent devices 62, the remaining devices 62 may be picked up in the same "checker-board" pattern in the next off-loading pass. Of course, non-adjacent devices 62 may be picked up even if it is possible to pick up an array of devices where the devices are adjacent to each other.

Currently, the pick-up devices 4 and the rack 40 allow the off-loading system of the present invention to transport semiconductor devices 62 at rates of 20,000–30,000 units per hour (UPH). However, due to the ease of scaling the size of the off-loading system of the present invention, it is possible to operate at even higher rates in the future. For example, a 50–15% increase in UPH may be possible in the future. The off-loading system may be increased in scale by increasing the number of pick-up devices in the array of pick-up devices, increasing the number of pins in the array of pins on the pin-board, or by increasing the number of channels 43 on the rack 40 by increasing the number of rails 42. The need for off-loading at faster rates is foreseeable since the semiconductor industry continues to demand the miniaturization of devices, which will likely cause the density of devices within semiconductor matrixes to increase. The increased performance of the off-loading system of the present invention obviates the need for multiple off-loading machines that operate at much lower speeds. Since these slower machines, which may off-load a single device in each pick-up pass, are not needed, costs are reduced and fabrication facility space is conserved.

FIG. 5A illustrates an alternative pattern for picking up non-adjacent devices 62. In the pattern shown in FIG. 5A, each of the devices to be picked up, 66, are separated in all directions along the matrix 60 by one device that will not be picked up. The array of pick-up devices 4 must make four passes over the matrix 60 in order to pick up all of the devices from the matrix 60. FIG. 5B shows the remaining devices 62 after the first pass of the pick-up devices 62. FIG. 5C shows that after the second pass, only half of the devices 62 remain in the matrix 60. Note that since a different array of devices 62 may be picked up in each pass, the remaining devices may be situated in a pattern different from that shown in FIGS. 5B–5D. FIG. 5D shows that only a quarter of the original devices 62 of the matrix 60 remain after the third pass. Not illustrated is the fact that no devices 62 of the original matrix 60 will remain after the fourth pass. The spacing between the devices to be picked up in the pick-up pattern illustrated in FIG. 5A effectively provides larger areas in which to located each of the pick-up devices 4. This makes it possible to use larger pick-up devices 4. As may be appreciated, the array of pick-up devices 4 may not contain enough pick-up devices 4 that which would allow all of the devices 62 of the matrix 60 to be picked up within four pick-up passes. In this case, additional pick-up passes would be required.

Figure 6:
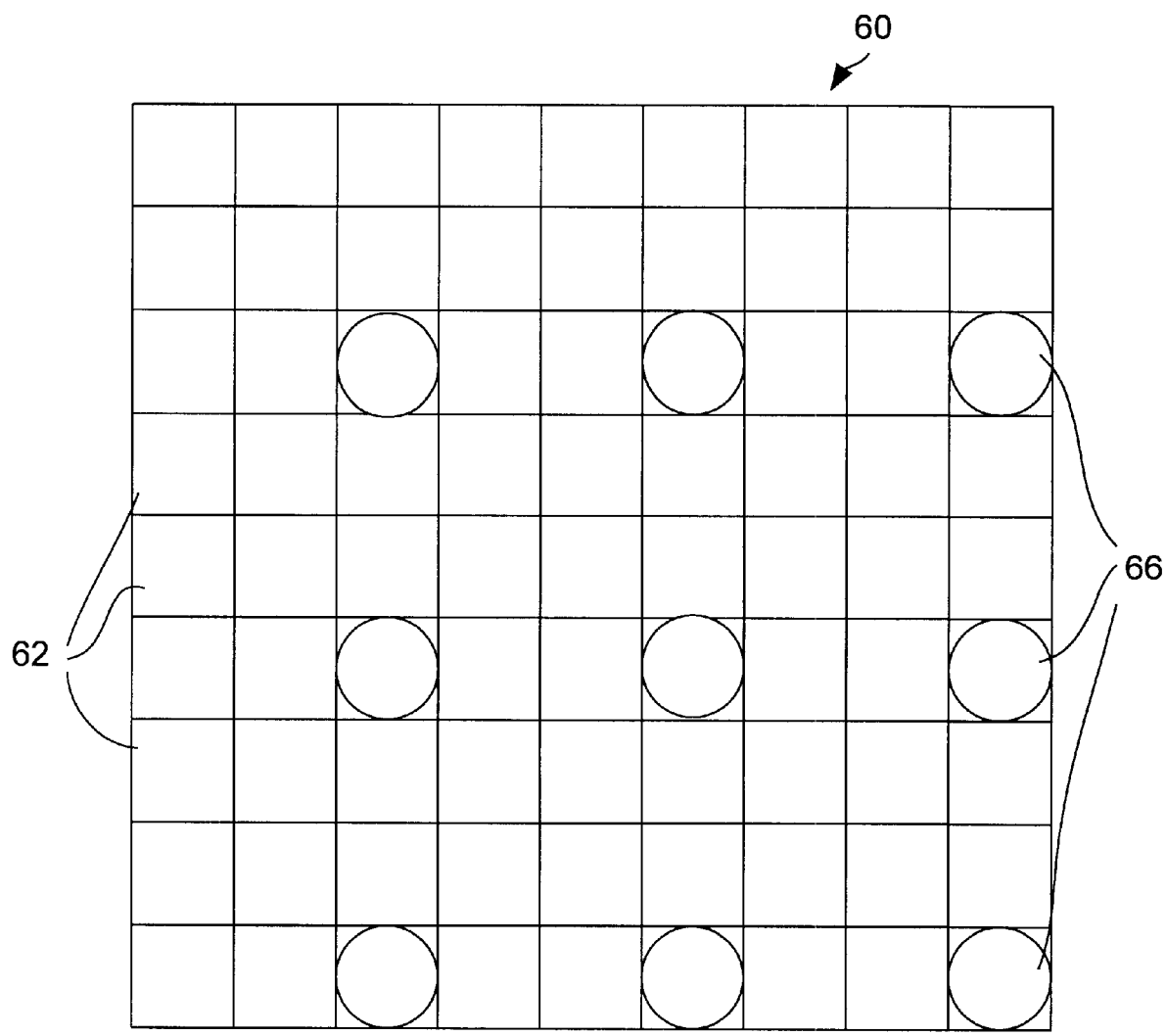
FIG. 6 illustrates yet another alternative pattern in which semiconductor devices may be picked up from a matrix of semiconductor devices.

The space provided between each of the devices 62 to be picked up in each pass of the off-loading process may be dependent upon the constraints of the pick-up devices 4, the rack 40 or of another handling station onto which semiconductor devices 62 may be deposited. Many various pick-up patterns may be used so that all of the devices within a matrix 60 may be picked up after a certain number of off-loading passes. For example, FIG. 6 illustrates another alternate embodiment of the pick-up pattern where each device to picked up, 66, is separated by two devices 62 that are not to be picked up within a respective row and column of the matrix 60. The pick-up pattern illustrated in FIG. 6 may be used to pick up all the devices 62 from the matrix 60 in nine or more pick-up passes.

While the off-loading system of the present invention has been described to be capable of depositing semiconductor devices 62 onto a rack 40, the present invention can also deposit the semiconductor devices 62 onto other stations within a manufacturing or packaging process. For instance, by using the control system 8 and the electronic map, as discussed above, the off-load system may be programmed to deposit defective semiconductor devices in a specially designated receptacle bin, while the fully-functional devices are deposited onto the rack 40. The off-loading system may selectively deposit the devices 62 either in the receptacle bin or onto the rack 40 by using the control system to control each of the pick-up devices 4. As may be appreciated, the off-loading system may be set up to deposit devices at a multiple number of various receptacle bins or processing stations. The off-loading system may also pick-up devices from any of the locations at which devices may be deposited so that at any one location, devices may be both deposited and picked up. The capability to pick-up and deposit devices at a multiple number of locations during a single pass of the off-loading process serves to increase the efficiency of the off-loading system. The off-loading system may also be programmed so that the fully-functional devices are deposited directly to the next processing stage, without having been deposited on the rack 40.

While this invention has been described in terms of several preferred embodiments, there are alteration, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. An off-loader suitable for simultaneously picking up and transporting a plurality of singulated, separately packaged semiconductor devices arranged in a matrix, the off-loader comprising:

a two-dimensional array of suction tubes, each of the suction tubes configured to pick up an associated packaged semiconductor device from the matrix of devices during the off-loading process;

a pump configured to pull air through the suction tubes so to create a sufficiently low pressure within the suction tubes to allow each suction tube to pick up a respective device; and a pin board which includes a two-dimensional array of pins configured to raise a selected array of the packaged semiconductor devices to assist in picking up the selected array of devices from the matrix of devices.

2. An off-loader as recited in claim 1 further comprising a control system configured to control each of the pins of the pin board such that the selected array of packaged semiconductor devices that are raised are packaged semiconductor devices that have been tested and are determined to be properly functioning.

3. The off-loader as recited in claim 1 wherein the matrix of semiconductor devices is secured on a contact tape, and wherein the pins are configured to puncture the contact tape to further assist in picking up the selected array of packaged semiconductor devices.

4. The off-loader as recited in claim 1 wherein each of the plurality of suction tubes further comprises a valve for controlling the air which is pulled through each of the suction tubes by the pump.

5. The off-loader as recited in claim 4 further comprising a control system configured to control each valve so to selectively control the air to be pulled through the suction tubes and thereby selectively off-load packaged devices.

6. The off-loader as recited in claim 5 further comprising an electronic map, the control system using information provided by the electronic map to selectively control each of the valves.

7. The off-loader as recited in claim 5 further comprising a sensor which is attached to each suction tube, the sensor configured to transmit a signal to the control system to inform the control system whether a packaged device has made a proper connection with each suction tube.

8. An off-loader as recited in claim 1 wherein the pins of the pin board are positioned directly adjacent to each other.

9. An off-loader as recited in claim 8 wherein the array of pins are positioned such that adjacent semiconductor devices within an matrix of devices can be simultaneously raised.

10. An off-loader as recited in claim 9 wherein the pin board contains a four by four array of pins.

11. An off-loader as recited in claim 9 wherein the pin board contains a ten by ten array of pins.

12. A system for simultaneously off-loading a plurality of packaged semiconductor devices from a matrix of packaged semiconductor devices, the system comprising:

a rack which includes a plurality of elongated rails and a base that supports the plurality of rails, wherein adjacent rails form channels arranged to receive the packaged semiconductor devices, the elongated rails being spaced such that each of a plurality of packaged semiconductor devices can be simultaneously loaded into respective channels of the rack; and an off-loader configured to simultaneously transport a plurality of packaged semiconductor devices from the matrix of devices to the rack, the off-loader including, a two-dimensional array of suction tubes, each of the suction tubes configured to pick up an associated packaged semiconductor device from the matrix of devices during the off-loading process;

a pump configured to pull air through the suction tubes so to create a sufficiently low pressure within the suction tubes to allow each suction tube to pick up a respective device; and a pin board which includes a two-dimensional array of pins configured to raise a selected array of the packaged semiconductor devices to assist in picking up the selected array of devices from the matrix of devices.

13. A system as recited in claim 12 further comprising a control system configured to control each of the pins of the pin board such that the selected array of packaged semiconductor devices that are raised are packaged semiconductor devices that have been tested and are determined to be properly functioning.

14. A system as recited in claim 12 wherein the pins of the pin board are positioned directly adjacent to each other.

15. A system as recited in claim 14 wherein the array of pins are positioned such that adjacent semiconductor devices within an matrix of devices can be simultaneously raised.

16. A system as recited in claim 15 wherein the pin board contains a four by four array of pins.

17. A system as recited in claim 16 wherein the pin board contains a ten by ten array of pins.

18. A system as recited in claim 12 further comprising:

an air jet configured to blow air in order to propel the packaged semiconductor devices along the length of the channels until each of the devices registers at a specific location along each of the respective channels.

19. A system as recited in claim 12 wherein the plurality of rails of the rack have a first end and a second end, the rails being tapered such that the packaged semiconductor devices are supported in a first orientation at the first ends of the rails and supported in a second orientation at the second ends of the rails, wherein the first orientation and the second orientation are offset from each other by 180 degrees.

20. A method for transporting packaged semiconductor devices from a matrix of semiconductor devices during a semiconductor assembly process using an off-loading system, the method comprising:

picking up, in a first pass, a first selected two-dimensional array of packaged semiconductor devices individually and simultaneously from the matrix of semiconductor devices;

depositing, in the first pass, at least one of the devices of the first selected array onto a handling station; and raising the first selected two-dimensional array of the packaged devices relative to the other packaged devices in the matrix in order to assist in picking up the first selected two-dimensional array of packaged devices from the matrix of semiconductor devices.

21. The method as recited in claim 20 wherein each of the devices within the array that are to be picked up from the matrix are separated by at least one device from the matrix that is not to be picked up.

22. The method as recited in claim 20 wherein the matrix of semiconductor devices is arranged in a plurality of rows and columns, and wherein every other device, or every third device, within each of the plurality of rows and columns is picked up.

23. The method as recited in claim 20 further comprising transporting at least one device from a first position to a second position on the handling station such that the at least one device becomes registered.

24. A method as recited in claim 23 further comprising:

blowing air at the device to propel the device along the handling station from the first position to the second position.

25. The method as recited in claim 20 further comprising vibrating the handling station in order to cause at least one device to travel from a first position to a second position on the handling station such that the at least one device becomes registered.

26. The method as recited in claim 20 further comprising:

picking up, in a second pass, a second selected array of packaged semiconductor devices individually and simultaneously from the matrix of semiconductor devices; and depositing, in the second pass, at least one of the devices of the second selected array onto the handling station which is part of the semiconductor assembly process.

27. The method as recited in claim 20 further comprising testing each of the semiconductor devices within the matrix of semiconductor devices prior to the operation of picking up the devices, the matrix of semiconductor devices being formed within a semiconductor wafer.

28. The method as recited in claim 27 further comprising singulating each of the semiconductor devices within the matrix of semiconductor devices.

29. The method as recited in claim 20 further comprising depositing in a receiving bin those of the devices which were not deposited onto the handling station.

30. The method as recited in claim 20 wherein each of the devices in the first selected array is picked up by a respective suction pick-up device.

31. The method as recited in claim 30 further comprising expelling air through each suction pick-up device so to separate a device from each of the suction pick-up devices.

32. The method as recited in claim 20 wherein the matrix of semiconductor devices is attached to a contact tape, and wherein the method further comprises puncturing the contact tape to further assist in picking up the first selected array of packaged semiconductor devices.

33. The method as recited in claim 20 further comprising sending electrical signals to a control system, the control system configured to control the off-loading system, the electrical signals indicating which of the devices are to be picked up and which of the devices that were picked up are to be deposited at the handling station.

34. A method as recited in claim 20 wherein the first selected array of packaged devices have been tested and are determined to be properly functioning.

* * * * *